(12) United States Patent
Kobayashi et al.

(10) Patent No.: US 11,276,579 B2
(45) Date of Patent: Mar. 15, 2022

(54) SUBSTRATE PROCESSING METHOD AND PLASMA PROCESSING APPARATUS

(71) Applicant: HITACHI HIGH-TECH CORPORATION, Tokyo (JP)

(72) Inventors: Hiroyuki Kobayashi, Tokyo (JP); Nobuya Miyoshi, Tokyo (JP); Kazunori Shinoda, Tokyo (JP); Yutaka Kouzuma, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 257 days.

(21) Appl. No.: 16/495,366

(22) PCT Filed: Nov. 14, 2018

(86) PCT No.: PCT/JP2018/042106
§ 371 (c)(1),
(2) Date: Sep. 18, 2019

(87) PCT Pub. No.: WO2020/100227
PCT Pub. Date: May 22, 2020

(65) Prior Publication Data
US 2021/0366721 A1 Nov. 25, 2021

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32449* (2013.01); *H01J 37/32724* (2013.01);
(Continued)

(58) Field of Classification Search
None
See application file for complete search history.

(56) References Cited

U.S. PATENT DOCUMENTS 7,416,989 B1 * 8/2008 Liu .................. H01L 21/02063
438/706
2011/0256726 A1 * 10/2011 LaVoie ............... H01L 21/0217
438/702
(Continued)

FOREIGN PATENT DOCUMENTS

JP 2016103632 A 6/2016
JP 201784976 A 5/2017
(Continued)

OTHER PUBLICATIONS

International Search Report dated Jan. 22, 2019 in PCT/JP2018/042106.

*Primary Examiner* — Shamim Ahmed
(74) *Attorney, Agent, or Firm* — Miles & Stockbridge, P.C.

(57) ABSTRACT

A substrate processing method for reducing a surface roughness of a semiconductor wafer by processing a film structure having at least two types of films beforehand disposed on the substrate, including steps of repeating an adsorption step of supplying activated particles into the processing chamber and allowing the particles to be adsorbed to a surface of a desirable film to be etched in the at least two types of films to allow the particles to combine with a material of the desirable film to form a reaction layer, a removal step of using plasma generated by supplying oxygen into the processing chamber to remove a deposit containing particles adhering to a surface of an undesirable film to be etched in the films, and a desorption step of desorbing and removing the reaction layer on the desirable film to be etched by heating the sample.

12 Claims, 12 Drawing Sheets

(a) REACTION LAYER FORMATION (b) CLEANING    (c) HEATING AND DESORPTION

(52) U.S. Cl.
CPC .... *H01L 21/0206* (2013.01); *H01J 2237/002* (2013.01); *H01J 2237/334* (2013.01)

(56) References Cited

U.S. PATENT DOCUMENTS

| | | | |
|---|---|---|---|
| 2015/0270148 A1* | 9/2015 | Shinoda | H01J 37/32724 |
| | | | 156/345.35 |
| 2016/0135274 A1 | 5/2016 | Fischer et al. | |
| 2017/0229290 A1 | 8/2017 | Kobayashi et al. | |
| 2017/0316935 A1* | 11/2017 | Tan | H01L 21/02115 |
| 2018/0076051 A1 | 3/2018 | Shinoda et al. | |
| 2018/0090345 A1* | 3/2018 | Kouzuma | H01L 21/67115 |

FOREIGN PATENT DOCUMENTS

| | | |
|---|---|---|
| JP | 2017143186 A | 8/2017 |
| JP | 201841886 A | 3/2018 |

\* cited by examiner

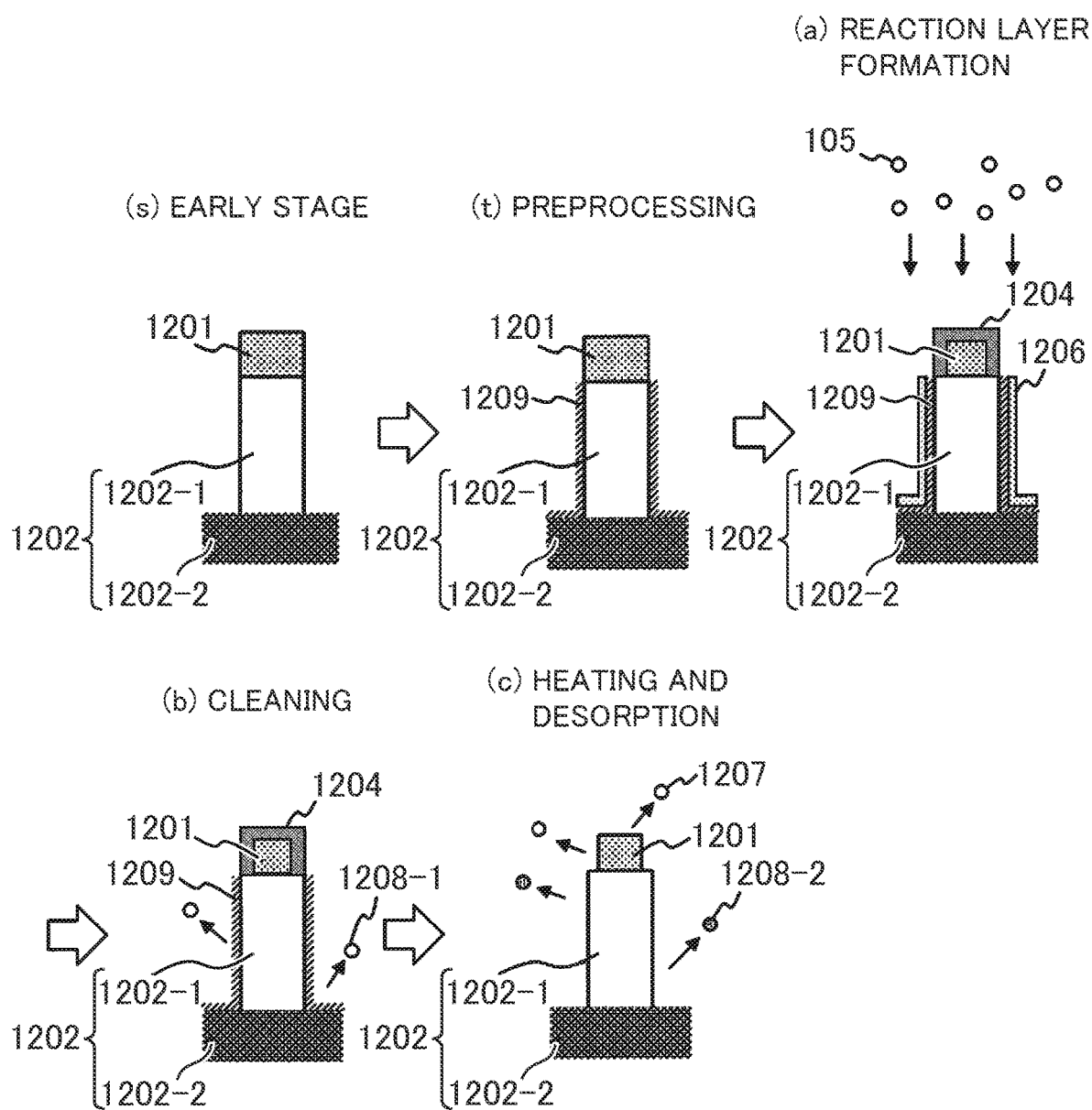

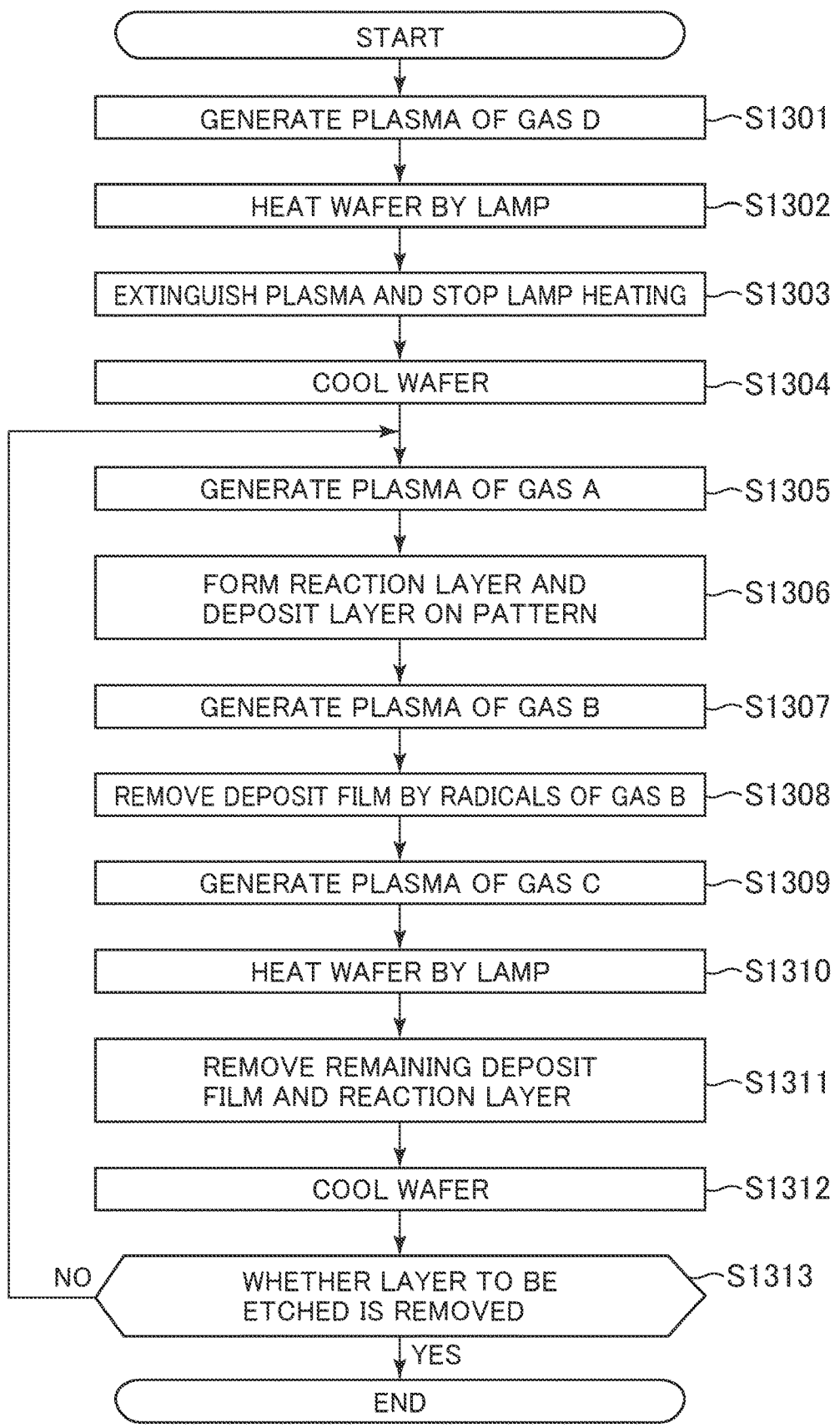

SUBSTRATE PROCESSING METHOD AND PLASMA PROCESSING APPARATUS

TECHNICAL FIELD

The present invention relates to a plasma processing apparatus performing etching by plasma irradiation and heating of a wafer as a sample to be processed having a substrate shape, and a processing method of the wafer as the substrate-shaped sample to be processed using the plasma processing apparatus.

BACKGROUND ART

In semiconductor devices, miniaturization and a three-dimensional device structure are increasingly developed due to a demand for low power consumption and an increase in memory capacity. In manufacturing of a device having a three-dimensional structure, since the structure is three dimensional and complicated, "isotropic etching" is frequently used, which allows not only traditional "vertical etching" performing etching in a vertical direction with respect to a wafer surface but also lateral etching performing etching in a lateral direction. Although the isotropic etching has been performed by a wet process using a chemical liquid, pattern collapse caused by surface tension of the chemical liquid or a difficulty in processing controllability is now actualized along with development of miniaturization. In the isotropic etching, therefore, it is required to replace the traditional wet process using a chemical liquid with a dry process without any chemical liquid.

A known method to accurately perform the isotropic etching by a dry process includes an adsorption/desorption type etching method as described in patent literature 1. In the etching method, radicals generated in plasma are first adsorbed to a surface of a layer to be etched on a wafer, and a reaction layer is formed through a chemical reaction (adsorption step). Subsequently, heat energy is applied to the wafer to desorb and remove the reaction layer (desorption step). The wafer is then cooled (cooling step). Etching is performed by cyclically repeating the adsorption step, the desorption step, and the cooling step.

In such a technique, when thickness of the reaction layer formed on the surface reaches a certain thickness in the adsorption step, since the reaction layer inhibits the radicals from reaching an interface between the layer to be etched and the reaction layer, growth of the reaction layer rapidly decelerates. Hence, even if incident quantity of the radicals varies within a complicated pattern shape, the reaction layer having a uniform thickness can be formed by setting an adequate adsorption time, and thus the etching amount can be advantageously made uniform independent of the pattern shape.

Furthermore, since the etching amount per cycle can be controlled to a level of several nanometers or less, processed amount can be advantageously controlled with a dimension accuracy of several nanometers. Further, highly selective etching can be advantageously performed using a fact that a radical species necessary for forming the reaction layer on the surface of the layer to be etched is different from a radical species that etches a film desirably having a low selectivity (to be desirably not shaved).

CITATION LIST

Patent Literature

Japanese Unexamined Patent Publication No. 2017-143186.

SUMMARY OF INVENTION

Technical Problem

In the adsorption/desorption type etching, while the reaction layer is formed by allowing the radicals to be adsorbed to the surface of the layer to be etched, the radicals may concurrently adhere to or be accumulated on a surface of a layer (undesirable layer to be etched) other than the layer to be etched. If heating is performed to remove the reaction layer formed on the surface of the layer to be etched in such a state, the surface of the layer other than the layer to be etched may chemically react with a deposit adhering to or accumulated on that surface, leading to a problem such as surface roughness.

However, the adsorption/desorption type etching as described in the patent literature 1 does not consider that the surface of the layer other than the layer to be etched chemically reacts with the deposit adhering to or accumulated on the surface, leading to the problem such as surface roughness.

The invention solves the above-described problem of the prior arts, and provides a plasma etching apparatus, in which radicals are adsorbed to a surface of a layer to be etched to form a reaction layer, and when the reaction layer is removed, the reaction layer can be removed while a surface of a layer other than the layer to be etched is not roughened by radicals adhering to or accumulated on the surface of the layer other than the layer to be etched, and provides a substrate processing method to be processed using the plasma etching apparatus.

Solution to Problem

To solve the above-described problems, the invention provides a substrate processing method to be processed, which processes a film structure having at least two types of films beforehand disposed on the sample to be processed disposed in a processing chamber within a vacuum vessel, in which the film structure is processed by repeating an adsorption step of supplying activated particles into the processing chamber and allowing the particles to be adsorbed to a surface of a desirable film to be etched in the films such that the particles combine with a material of a film as the upper layer to form a reaction layer; a removal step of using plasma generated by supplying oxygen into the processing chamber to remove a deposit containing particles, which adhere to a surface of an undesirable film to be etched in the films, the particles being some of the activated particles supplied into the processing chamber; and a desorption step of desorbing and removing the reaction layer on the desirable film to be etched by heating the sample to be processed subjected to the adsorption step and the removal step.

Furthermore, to solve the above-described problems, the invention provides a plasma processing apparatus including a plasma generation chamber; a processing chamber connected to the plasma generation chamber and internally having amounting stage on which a sample to be processed is mounted; a processing gas supply section that supplies a processing gas into the plasma generation chamber; a plasma generation section that generates plasma within the processing chamber containing the processing gas supplied by the processing gas supply section; a heating section having a lamp to heat the sample to be processed mounted on the mounting stage in the processing chamber; a slit plate (ion shield plate) provided between the plasma generation section and the mounting stage and having a plurality of holes to shield ions while passing radicals or gases therethrough; a cooling gas supply section that supplies a gas, which cools the sample to be processed mounted on the mounting stage in the processing chamber, to between the sample to be processed and the mounting stage; and a control section that controls the processing gas supply section, the plasma generation section, the heating section, and the cooling gas supply section, where the control section is configured to repeatedly perform a process in which while the processing gas supply section is controlled to supply a first processing gas into the plasma generation chamber, the plasma generation section is controlled to generate plasma of the first processing gas within the plasma generation chamber to generate a reaction species, and the reaction species supplied from the plasma generation chamber into the processing chamber is allowed to adhere to a plurality of films beforehand disposed on the sample to be processed cooled by controlling the cooling gas supply section so as to react with a material of a surface of a desirable film to be etched to form a reaction layer; a process in which while the processing gas supply section is controlled to switch a gas to be supplied into the plasma generation chamber from the first processing gas to a second processing gas, the plasma generation section is controlled to generate plasma of the second processing gas within the plasma generation chamber to activate the second processing gas, and the activated second processing gas supplied from the plasma generation chamber into the processing chamber is used to remove the reaction species adhering to a surface of an undesirable film to be etched in the films on the sample to be processed cooled by controlling the cooling gas supply section; and a process in which the heating section is controlled to heat the sample to be processed, thereby the reaction species adhering to a portion other than the desirable film to be etched is removed, and the reaction layer formed on the surface of the desirable film to be etched is vaporized and desorbed from the desirable film to be etched.

Advantageous Effects of Invention

According to the invention, a method of removing a layer to be etched by cycle processing of reaction layer formation by radical irradiation, heating/desorption, and cooling makes it possible to securely remove the layer to be etched while suppressing surface roughness or shaving of a surface of a layer other than the layer to be etched.

BRIEF DESCRIPTION OF DRAWINGS

FIG. 12 includes views illustrating a change in state of a fine pattern on a wafer as a sample to be processed in the third embodiment of the invention.
FIG. 13 is a flowchart illustrating a procedure of processing in the third embodiment of the invention.

DESCRIPTION OF EMBODIMENTS

Figure 1:
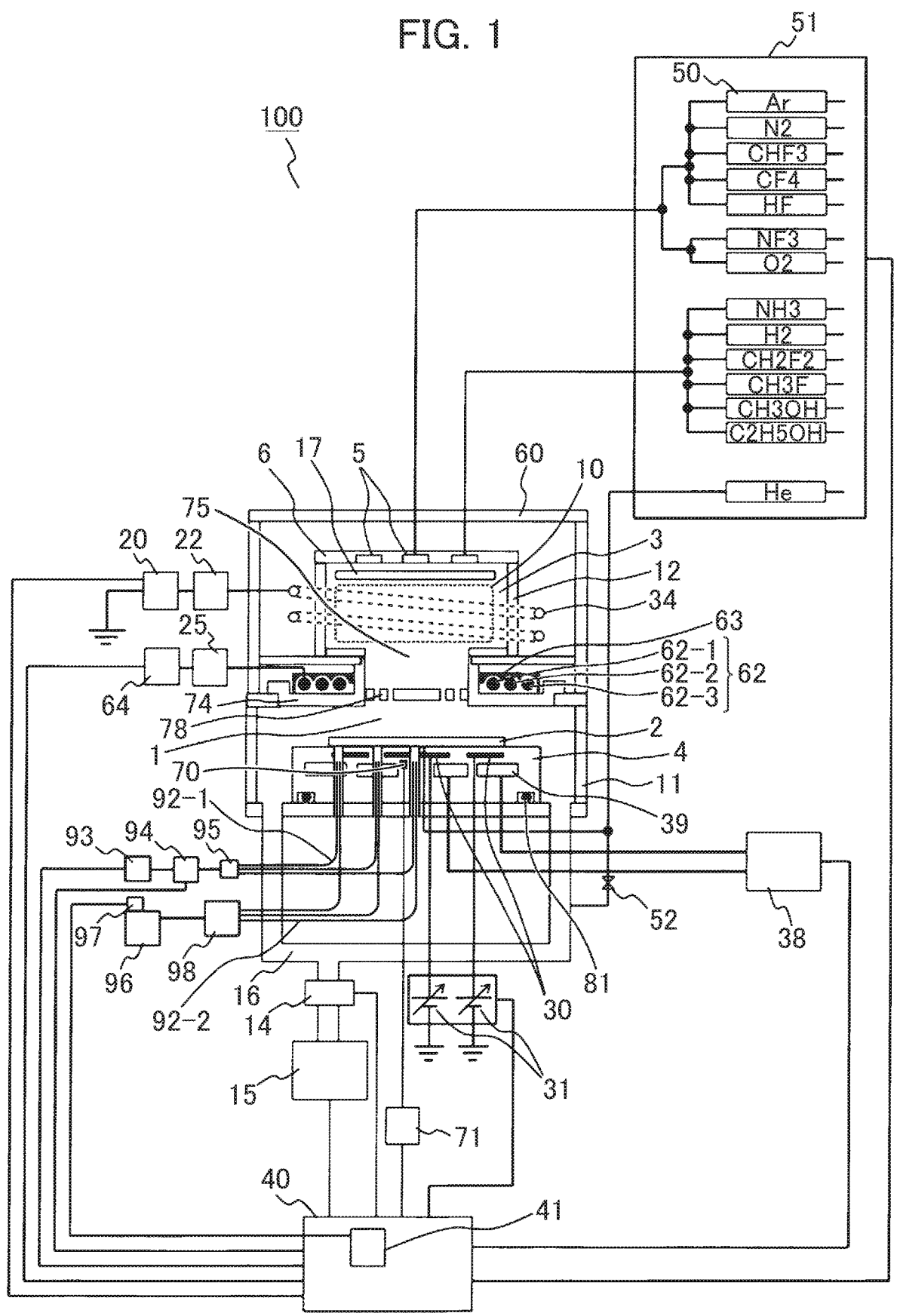
FIG. 1 is a block diagram showing an overall schematic configuration of an etching apparatus of the invention.

In the invention, a plasma processing apparatus having a plasma source and an IR lamp for heating a wafer as a sample to be processed is designed such that a reaction layer is formed on a surface of the layer to be etched through irradiation of first radicals, and then second radical irradiation is performed to remove a component that is removable at low temperature in a deposit formed through adhesion or accumulation during irradiation of the first radicals on a surface of a layer other than the layer to be etched, and then when the wafer as the sample to be processed is heated by the IR lamp to remove the reaction layer, irradiation of third radicals is performed to remove a deposit, which has not been completely removed during the second-radical irradiation and adheres to the surface of the layer other than the layer to be etched, making it possible to suppress surface roughness or etching of the surface of the layer other than the layer to be etched during cycle processing of reaction layer formation by radical irradiation, heating/desorption, and cooling. Hereinafter, some embodiments of the invention are described in detail with reference to drawings.

First Embodiment

First, a summary including an overall configuration of a plasma processing apparatus 100 according to an embodiment of the invention is described with reference to FIG. 1.
The processing chamber 1 is configured of a base chamber 11, in which a wafer stage 4 (hereinafter, referred to as stage 4) is provided to mount a wafer 2 as the sample to be processed (hereinafter, referred to as wafer 2) thereon. A plasma source having a quartz chamber 12, an ICP coil 34, and a high-frequency power source 20 is provided above the processing chamber 1, and an inductively coupled plasma (ICP) discharge method is used for the plasma source. The cylindrical quartz chamber 12 is provided above the processing chamber 1 so as to configure the ICP plasma source, and the ICP coil 34 is provided on the outside of the quartz chamber 12.
The ICP coil 34 is connected to the high-frequency power source 20 for plasma generation via a matching box 22. A frequency band of several tens of megahertz, such as 13.56 MHz, is used as a frequency of high-frequency power. A top plate 6 is provided at the top of the quartz chamber 12. A shower plate 5 is provided in the top board 6, and a gas dispersion plate 17 is provided below the shower plate 5. A processing gas is introduced into the processing chamber 1 from the periphery of the gas dispersion plate 17.

Supply flow rate of the processing gas is controlled by a mass flow controller 50 provided for each of gas species. Although $NH_3$, $H_2$, $CH_2F_2$, $CH_3F$, $CH_3OH$, $O_2$, $NF_3$, Ar, $N_2$, $CHF_3$, $CF_4$, and HF are shown as the processing gases in FIG. 1, another gas may be used.

A lower part of the processing chamber 1 is connected to exhaust means 15 through a vacuum exhaust pipe 16 to reduce a pressure in the processing chamber. The exhaust means 15 is configured by a turbo molecular pump, a mechanical booster pump, or a dry pump, for example. Pressure adjusting means 14 is provided on an upstream side of the exhaust means 15 to adjust pressure in the processing chamber 1 or of a discharge region 3.

An IR lamp unit to heat the wafer 2 is provided between the stage 4 and the quartz chamber 12 configuring the ICP plasma source. The IR lamp unit mainly includes an IR lamp 62, a reflection plate 63 to reflect IR light, and an IR light transmission window 74. A circular lamp is used for the IR lamp 62. Light emitted from the IR lamp 62 mainly includes light (herein, referred to as IR light) ranging from visible light to infrared light. Although three circuits of IR lamps 62-1, 62-2, and 62-3 are provided as the IR lamp 62 in the configuration of FIG. 1, two or four circuits may be used, for example. A reflection plate 63 is provided above the IR lamp 62 so as to reflect the IR light downward (toward a position where the wafer 2 is provided).

The IR lamp 62 is connected to an IR lamp power source 64 while a high-frequency cut filter 25 is mounted midway so as to prevent noise, which is generated by the high-frequency power source 20, of high-frequency power for plasma generation from flowing into the IR lamp power source 64. In addition, the IR lamp power source 64 has a function of controlling powers supplied to the IR lamps 62-1, 62-2, and 62-3 independently of one another, making it possible to regulate radial distribution of heating amount for the wafer.

A gas passage 75 is formed in the middle of the IR lamp unit so as to make the gas flow, which is supplied from each mass flow controller 50 into the quartz chamber 12, toward the processing chamber 1. A slit plate (ion shield plate) 78 having a plurality of holes is provided in the gas passage 75 so as to shield ions and electrons generated in the plasma generated within the quartz chamber 12 and transmit only neutral gases and radicals that are then applied to the wafer 2.

A coolant passage 39 is formed within the stage 4 so as to cool the stage 4, and the coolant is circularly supplied by a chiller 38. Electrostatic adsorption electrodes 30 each having a plate shape are embedded in the stage 4 to fix the wafer 2 to the stage 4 by electrostatic chuck, and a DC power source 31 for electrostatic adsorption is connected to each of the electrodes 30.

He gas can be supplied to between the back surface of the wafer 2 mounted on the stage 4 and the stage 4 so as to efficiently cool the wafer 2. The surface (wafer-mounting surface) of the stage 4 is coated with a resin such as polyimide so that even if heating and cooling are performed while the electrostatic adsorption electrode 30 is operated to electrostatically adsorb the wafer 2, the back surface of the wafer 2 is not damaged. A thermocouple 70 is provided within the stage 4 so as to measure temperature of the stage 4, and connected to a thermocouple thermometer 71.

Optical fibers 92-1 and 92-2 to measure temperature of the wafer 2 are provided at three points, i.e., the vicinities of the center, the radially middle, and the periphery of the wafer 2. The optical fibers 92-1 guide IR light from an external IR light source 93 to the back surface of the wafer 2 and irradiate the IR light to the back surface of the wafer 2. On the other hand, the optical fibers 92-2 collect IR light, which is transmitted inside the wafer and reflected at the top surface of the wafer, and transmits the collected IR light to a spectroscope 96.

The external IR light generated by the external IR light source 93 is transmitted to an optical-path switch 94 for ON/OFF of an optical path. Subsequently, the light is branched into two or more by an optical distributer 95 (in FIG. 1, three), and the three light beams are applied to the respective positions on the back-surface side of the wafer 2 through the three optical fibers 92-1.

The IR light is absorbed or reflected by the wafer 2, and transmitted to the spectroscope 96 through the optical fibers 92-2, and data on wavelength dependence of spectral intensity are obtained by a detector 97. Such data on wavelength dependence of spectral intensity are sent to an arithmetic section 41 of a control section 40 to calculate an absorption wavelength. Temperature of the wafer 2 can be determined with reference to the absorption wavelength. An optical multiplexer 98 is provided on the way of the optical fibers 92-2, making it possible to switch a measurement point, at which light is spectroscopically measured, between the wafer center, the wafer middle, and the wafer periphery. Consequently, the arithmetic section can obtain the temperature at each of the wafer center, the wafer middle, and the wafer periphery.

In FIG. 1, 60 represents a container covering the quartz chamber 12, and 81 represents an O ring for vacuum sealing between the stage 4 and the bottom surface of the base chamber 11.

The control section 40 controls ON/OFF of supply of high-frequency power from the high-frequency power source 20 to the ICP coil 34. In addition, the control section 40 controls a mass-flow-controller control section 51 to adjust a kind and flow rate of a gas supplied from each mass flow controller 50 into the quartz chamber 12. In this state, the control section further operates the exhaust means 15 and controls the pressure adjusting means 14 to adjust the inside of the processing chamber 1 to a desired pressure (the degree of vacuum).

Further, the control section 40 operates the DC power source 31 for electrostatic adsorption to allow the wafer 2 to be electrostatically adsorbed to the stage 4, and while a mass flow controller 50 is operated so as to supply He gas to between the wafer 2 and the stage 4, and controls the IR lamp power source 64 and the chiller 38 such that temperature of the wafer 2 is within a predetermined temperature range on the basis of temperature distribution information of the wafer 2 obtained by the arithmetic section 41 based on internal temperature of the stage 4 measured by the thermocouple thermometer 71, and the spectral intensity information at the vicinity of each of the center, the radially middle, and the periphery of the wafer 2 measured by the detector 97.

Figure 2:
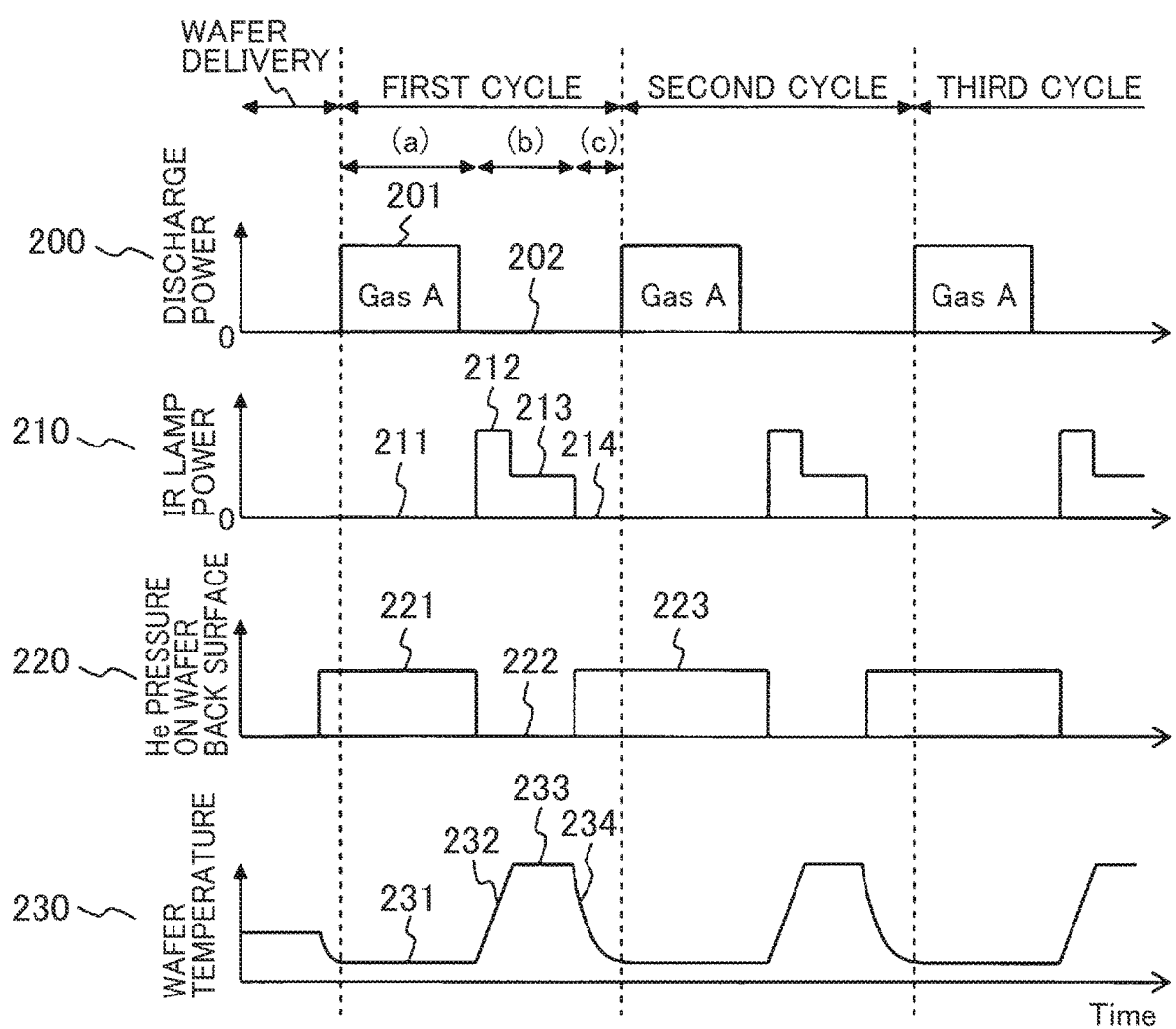
FIG. 2 is a time chart of basic processing of main components associated with a first embodiment of the invention.
Figure 3:
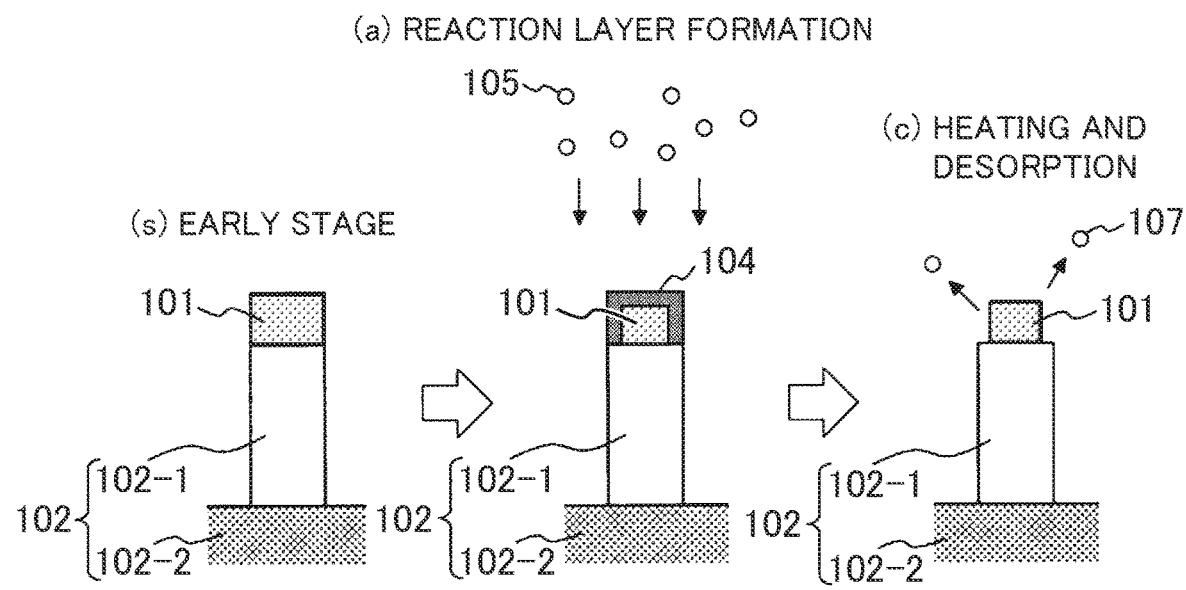
FIG. 3 includes views illustrating a change in state of a fine pattern on a wafer as a sample to be processed in the time chart of FIG. 2 in the first embodiment of the invention.

Subsequently, a method of performing a basic etching process using the plasma processing apparatus 100 described with reference to FIG. 1 is described with reference to FIGS. 2 and 3. FIG. 2 shows a time chart, and FIG. 3 shows an example of a state of a fine pattern on the wafer. In FIG. 3, the layer to be etched corresponds to a film 101, and a layer (undesirable layer to be etched) other than the layer to be etched corresponds to a film 102 (in FIG. 3, layers 102-1 and 102-2). In the example of FIG. 3, materials of the films are, for example, as follows: a nitride film including SiN or TiN for the film 101 as the layer to be etched (hereinafter, referred to as layer to be etched 101), and a film other than the nitride film, including $SiO_2$, p-Si, SiOC, SiGe, TiO, $Al_2O_3$, for the film 102 (layers 102-1 and 102-2).

First, the wafer 2 is carried into the processing chamber through an undepicted carry-in entrance provided in the processing chamber 1 and mounted on the stage 4, and then the control section 40 operates the DC power source 31 for electrostatic adsorption so that the wafer 2 is allowed to be electrostatically adsorbed to the stage 4, and controls the mass-flow-controller control section 51 to supply He gas for wafer cooling from amass flow controller 50 for He gas to between the back surface of the wafer 2 and the stage 4 so that pressure 220 of He gas between the back surface of the wafer 2 and the stage 4 is set to a predetermined pressure (state 221), and the wafer 2 is cooled to decrease wafer temperature 230 to temperature 231. For example, the wafer temperature 231 is −20 to +20° C., and wafer temperature 233 is 80 to 300° C. In this state, as shown in FIG. 3(a), the pattern has a sectional shape, in which the layer to be etched 101 is formed so as to cover the upper surface of the layer 102-1 as an undesirable layer to be etched.

Further, the plurality of mass flow controllers 50 are used to adjust flow rate of processing gas A to be supplied into the processing chamber 1, and the degree of opening of the pressure adjusting means 14 is adjusted to set internal pressure of each of the processing chamber 1 and the quartz chamber 12 to a target pressure. In this state, the control section 40 turns on the high-frequency power source 20 to input discharge power (discharge power 200 is in a state 201). Consequently, plasma discharge starts within the quartz chamber 12 to generate plasma 10 within the quartz chamber 12. At this time, power (IR lamp power) 210 applied to the IR lamp 62 is zero (state 211).

In this state, part of the processing gas is ionized and dissociated by the plasma 10. Nonionized, neutral gas and radicals in the generation region of the plasma 10 are applied to the wafer 2 while passing through the slit plate 78. As a result, radicals 105 are adsorbed to the surface of the wafer so that a reaction layer 104 is formed on the surface of the layer to be etched 101 (corresponding to a period (a) in the first cycle of FIG. 2, or a state (a) of FIG. 3).

When generation of the reaction layer 104 is completed, the control section 40 turns off the high-frequency power source 20 (discharge power 200 is in a state 202), and thus stops the plasma discharge. Supply of the He gas to the wafer back surface is then stopped, and a valve 52 is opened to allow pressure on the back surface of the wafer to be similar to internal pressure in the processing chamber (He gas on the wafer back surface is exhausted (He pressure 220 on the wafer back surface is in a state 222).

Subsequently, the control section 40 controls output of the IR lamp power source 64 to be turned on to switch the IR lamp 62 on (IR lamp power 210 is in a state 212). IR light emitted from the IR lamp 62 is transmitted by an IR light transmission window 74 and heats the wafer 2 (wafer temperature 230 is in a state 232). When the wafer temperature 230 reaches a certain value (state 233), the control section 40 controls output of the IR lamp power source 64 to be decreased (IR lamp power 210 is in a state 213), and maintains the temperature of the wafer 2 to be constant for a certain time. The temperature of the wafer 2 is thus maintained constant, thereby the reaction layer 104 formed on the surface of the layer to be etched 101 is excited by a thermal reaction and volatilized from the surface of the layer to be etched 101, and desorbs as a vaporization product (volatile) 107 from the reaction layer. As a result, the layer to be etched 101 is exposed (desorption step) (corresponding to a period (b) in the first cycle of FIG. 2, or a state (c) of FIG. 3).

The temperature of the wafer 2 is maintained in a state 233 for a certain time, and then output of the IR lamp power source 64 is turned off (state 214) to stop heating of the wafer 2. Subsequently, the control section 40 controls a mass flow controller 50 for Ar gas supply and the mass flow controller 50 for He gas supply to supply He gas to between the back surface of the wafer 2 and the stage 4 while suppling Ar gas into the processing chamber 1 (state 223) to start cooling of the wafer 2 (state 234, corresponding to a period (c) in the first cycle of FIG. 2).

When cooling of the wafer 2 is finished, radical irradiation is restarted (subsequent cycle, second cycle). Etching is then performed step-by-step by repeating the cycle of radical adsorption, heating/desorption, and cooling. Electrostatic adsorption is ON throughout the cycle processing for continuous adsorption. When etching is finished, the electrostatic adsorption is turned off, and the wafer 2 is carried out from the processing chamber 1.

Figure 4:
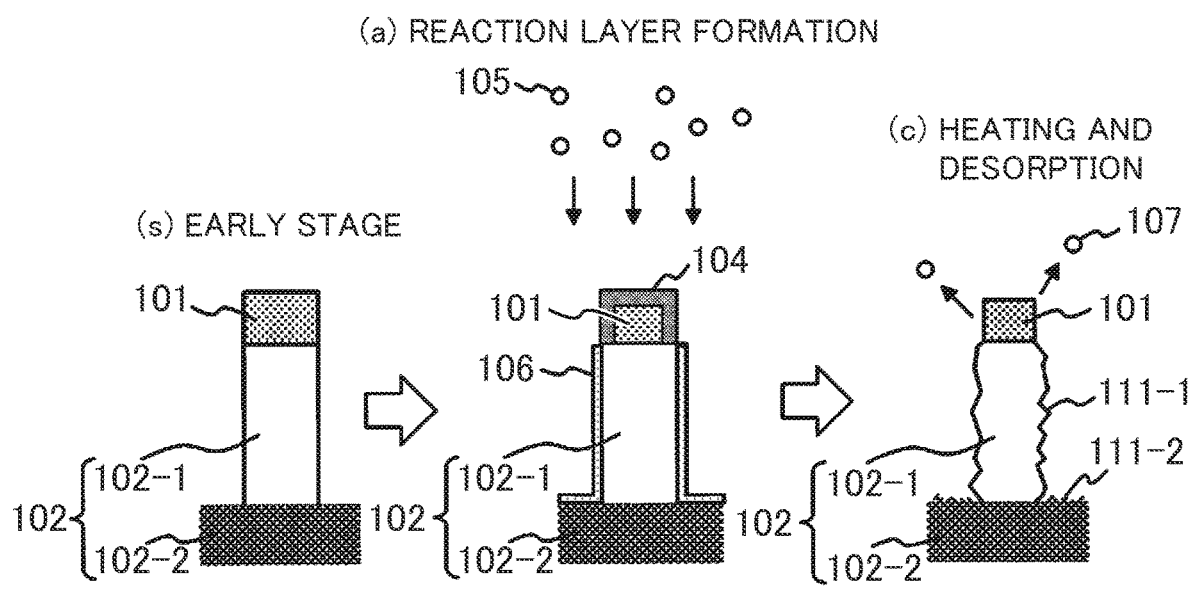
FIG. 4 includes views illustrating a change in state of the fine pattern on the wafer as the sample to be processed to explain a problem of the first embodiment of the invention.

A problem of the above-described processing is now described with reference to FIG. 4. In contrast to the initial state of FIG. 4(s), in the reaction layer formation step of FIG. 4(a) (corresponding to the period (a) of FIG. 2), when radicals are applied to form the reaction layer 104, the applied radicals are adsorbed to or accumulated on the surfaces of the layers 102-1 and 102-2 (hereinafter, such layers are generically called undesirable layer to be etched 102), so that a deposit film (accumulation layer) 106 may be formed. If heating is performed in this state to remove the reaction layer 104 and the deposit film 106 as subsequent processing (corresponding to a step of the period (b) of FIG. 2), the deposit film 106 chemically reacts with the surface of the undesirable layer to be etched 102, and thus an alteration product may be formed on the surface, or the surface may be etched, leading to surface roughness 111-1 or 111-2.

This is described with an exemplary case where the layer to be etched 101 includes SiN, and the undesirable layer to be etched 102 includes the layer 102-1 including p-Si and the layer 102-2 including $SiO_2$.

First, a processing gas containing, O, C, F, and H is introduced into the quartz chamber 12, and high-frequency power is applied from the high-frequency power source 20 to the ICP coil 34 to generate plasma within the quartz chamber 12.

Subsequently, radicals generated in the plasma are made to flow into the processing chamber 1 and applied to the wafer so that a reaction layer including an ammonium salt of $(NH_4)_2SiF_6$ having a certain thickness is formed as the reaction layer 104 on the surface of a SiN film as the layer to be etched 101. At this time, C, F, H, and O adhere onto the surface of p-Si of the layer 102-1 or $SiO_2$ of the layer 102-2 of the undesirable layer to be etched 102.

If heating is performed in this state, the reaction layer 104 formed on the SiN film as the layer to be etched 101 volatilizes in a form of HF, $SiF_4$, or $NH_4F$. On the other hand, in the surface on which the deposit film 106 of p-Si of the layer 102-1 or $SiO_2$ of the layer 102-2 of the undesirable layer to be etched 102 is formed, the deposit film 106 does not perfectly volatilize and thus residues containing $SiF_x$ or $SiH_x$ may be formed, or the deposit film 106 partially volatilizes in a form of $SiF_4$ or $SiH_4$. As a result, damage such as surface roughness 111-1 or 111-2 may occur on the surface of each of the undesirable layers to be etched 102-1 and 102-2.

Figure 5:
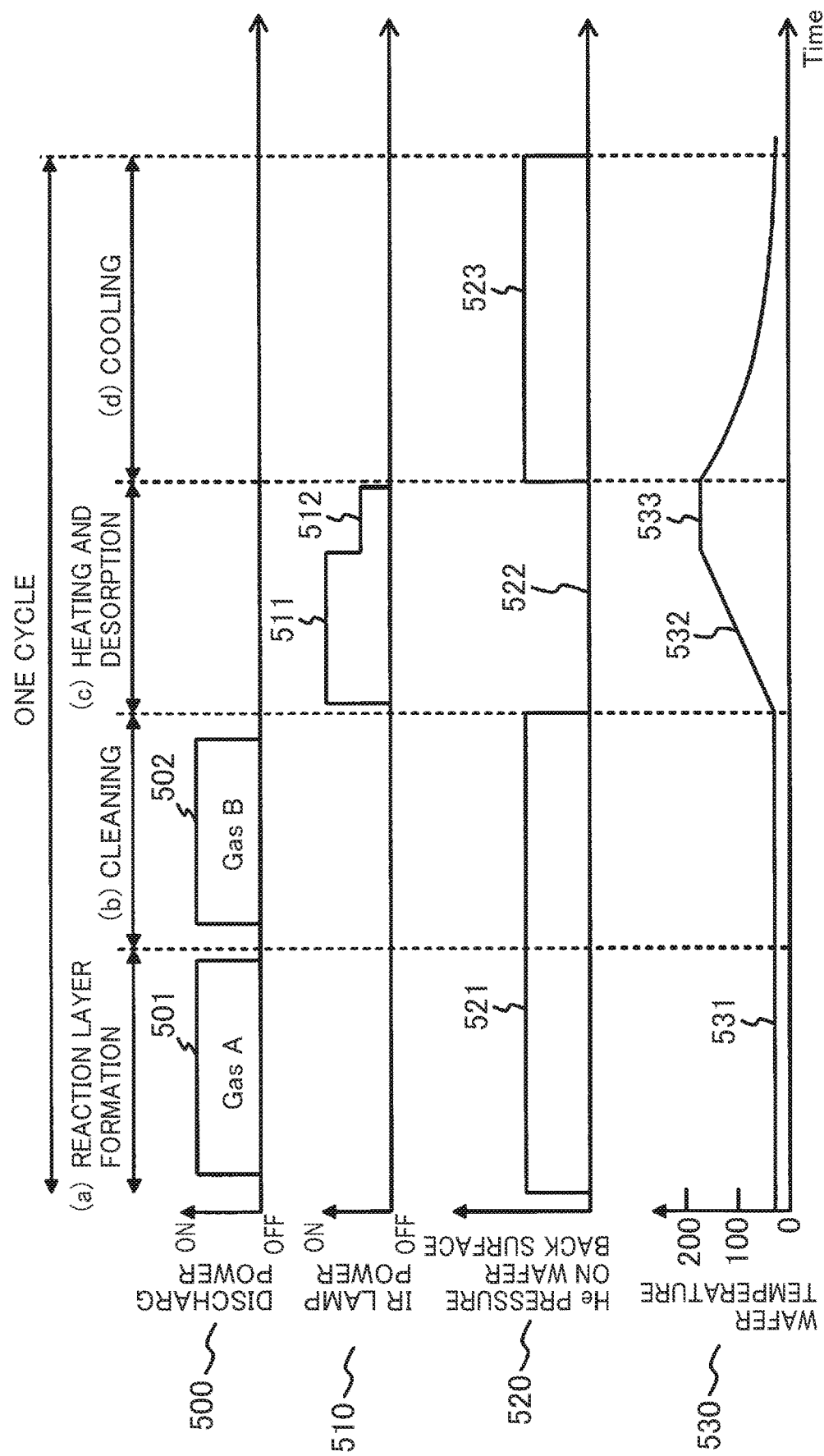
FIG. 5 is a time chart of the basic processing of the main components of the first embodiment of the invention.
Figure 6:
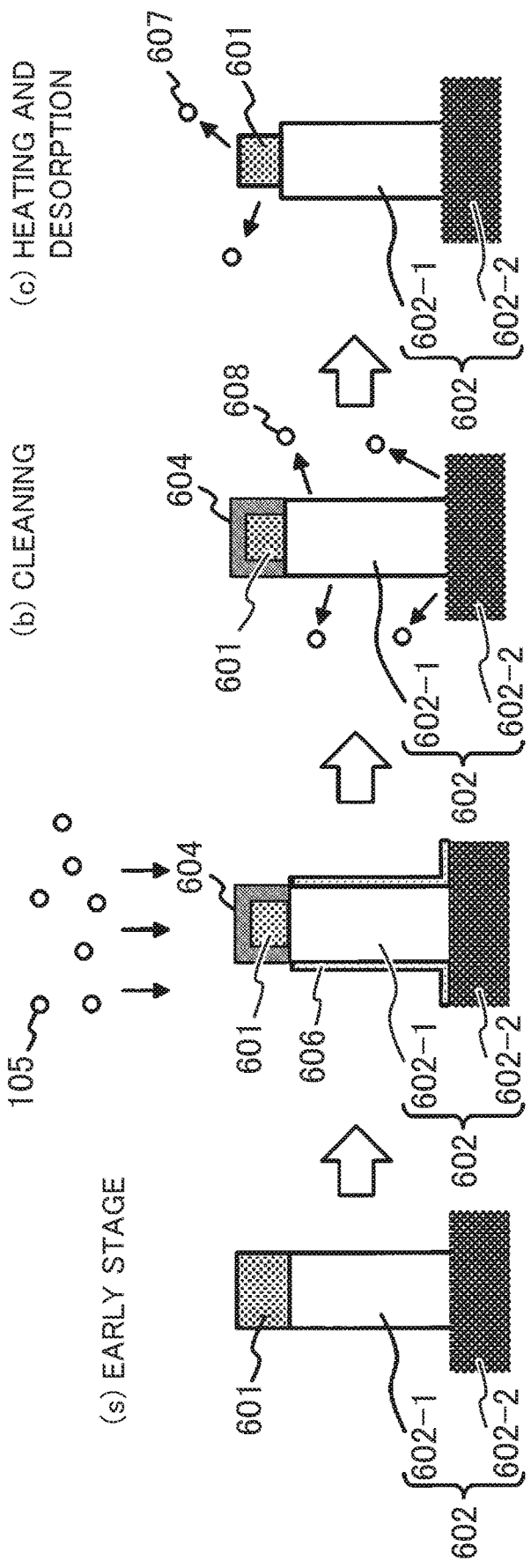
FIG. 6 includes views illustrating a change in state of the fine pattern on the wafer as the sample to be processed in the first embodiment of the invention.

Subsequently, a first embodiment is described as a method of solving the above-described problem with reference to FIGS. 5 and 6. FIG. 5 shows a processing time chart, and FIG. 6 shows a state of a fine pattern on the wafer. In the sectional structure of the fine pattern of FIG. 6(*s*), as with FIG. 3(*s*), a layer to be etched 601 is formed over a layer 602-1 as an undesirable layer to be etched. A layer 602-2 is also an undesirable layer to be etched, and corresponds to the layer 102-2 as the undesirable layer to be etched in FIG. 3.

The following steps are the same as those described with reference to FIG. 2: the wafer 2 is electrostatically adsorbed to the stage 4, and then He gas is introduced to between the back surface of the wafer 2 and the stage 4 so that pressure of the He gas is set to a predetermined pressure (He gas pressure 520 is in a state 521), and then the wafer 2 is cooled so as to be set to a predetermined temperature (wafer temperature 530 is in a state 531), and then flow rate of the processing gas A to be supplied into the processing chamber 1 is adjusted by a plurality of mass flow controllers 50.

Plasma discharge is performed with the processing gas A within the quartz chamber 12 in such a state (discharge power 500 is in a state 501), and radicals generated in the plasma are carried into the processing chamber 1 while being passed through the slit plate 78 and are applied to the wafer 2 to form a reaction layer 604 on the surface of the layer to be etched 601 as a desirable film to be etched (reaction layer formation of FIG. 5(*a*)). At this time, an initial sectional shape of a pattern formed on the wafer 2 has a shape as shown in FIG. 6(*a*). In addition, the radicals also adhere to undesirable layers to be etched 602-1 and 602-2 (hereinafter, such layers are generically called undesirable layer to be etched 602), and thus a deposit film 606 is formed (sectional shape of FIG. 6(*a*)).

Subsequently, the plasma discharge of the processing gas A and supply of the processing gas A into the quartz chamber 12 are stopped, and then a gas B is supplied into the quartz chamber 12 while flow rate of the gas B is adjusted by the mass flow controllers 50. In this state, a cleaning step is performed such that the gas B is supplied into the quartz chamber 12 for plasma discharge within the quartz chamber 12 (discharge power 500 is in a state 502).

Radicals of the gas B generated by such plasma discharge within the quartz chamber 12 are delivered into the processing chamber 1 through the slit plate 78 and supplied to the wafer 2. On the surface of the wafer 2 that is thus irradiated with the radicals of the gas B, the deposit film 606 is formed on the surface of the undesirable layer to be etched 602 and reacts with the radicals of the gas B so as to be vaporized in a form of a vaporization product (volatile) 608 from the deposit film. This allows the deposit film 606 to be selectively removed from the surface of the wafer 2 (cleaning of FIG. 5(*b*), a sectional shape of FIG. 6(*b*)). Specifically, the gas B selectively includes a material that selectively reacts with the deposit film 606. At this time, He gas is introduced into between the back surface of the wafer 2 and the wafer stage to maintain a predetermined pressure (He gas pressure 520 is in the state 521), and thus temperature 531 of the wafer 2 is kept cooled.

Plasma discharge is performed with the gas B fora certain time to remove the deposit film 606 formed on the surface of the undesirable layer to be etched 602, and then the plasma discharge and supply of the gas B into the quartz chamber 12 are stopped. At this time, supply of the He gas onto the wafer back surface is also stopped, and the valve 52 is opened such that pressure on the back surface of the wafer is similar to internal pressure in the processing chamber (He gas on the wafer back surface is exhausted to adjust the He gas pressure to a pressure 522).

In this state, the control section 40 controls output of the IR lamp power source 64 to be turned on to switch the IR lamp 62 on (IR lamp power 510 is in a state 511). IR light emitted from the IR lamp 62 is transmitted by the IR light transmission window 74 and heats the wafer 2 (wafer temperature 530 is in a state 532). When temperature of the wafer 2 reaches a certain value (wafer temperature 530 is in a state 533), the control section 40 controls output of the IR lamp power source 64 to be reduced (IR lamp power 510 is in a state 512) such that the temperature of the wafer 2 is maintained constant for a certain time.

The temperature of the wafer 2 is thus maintained constant for a certain time, thereby the reaction layer 604 is vaporized in a form of a vaporization product (volatile) and desorbed from the surface of the layer to be etched 601. Consequently, as shown in a section of a pattern of heating/desorption of FIG. 6(*c*), it is possible to remove the reaction layer 604 formed on the surface of the layer to be etched 601 and expose the layer to be etched 601 without damage such as surface roughness to the surface of the undesirable layer to be etched 602.

The temperature of the wafer 2 is maintained constant for a certain time, thereby the reaction layer 604 is vaporized in a form of a vaporization product 607 and desorbed from the surface of the layer to be etched 601, and then the IR lamp power 510 is turned off, and He is supplied to the back surface of the wafer such that He pressure on the wafer back surface is in a state 523 to cool the wafer 2.

When a component of the deposit film 606 formed on the surface of the undesirable layer to be etched 602 is, for example, CF-based, although $O_2$ is a first candidate for the gas B used in the cleaning step, not only $O_2$ but also a processing gas mainly containing $H_2$ or $N_2$ may be used as the gas B in the cleaning step of FIG. 6(*b*) depending on the component of the deposit film 106. However, in the cleaning step, a gas species of the processing gas B must be selected so as to prevent formation of residues caused by insufficient desorption of the reaction layer 604 in the subsequent heating/desorption step due to a change in a chemical property of the reaction layer 604 by a radical reaction.

Figure 7:
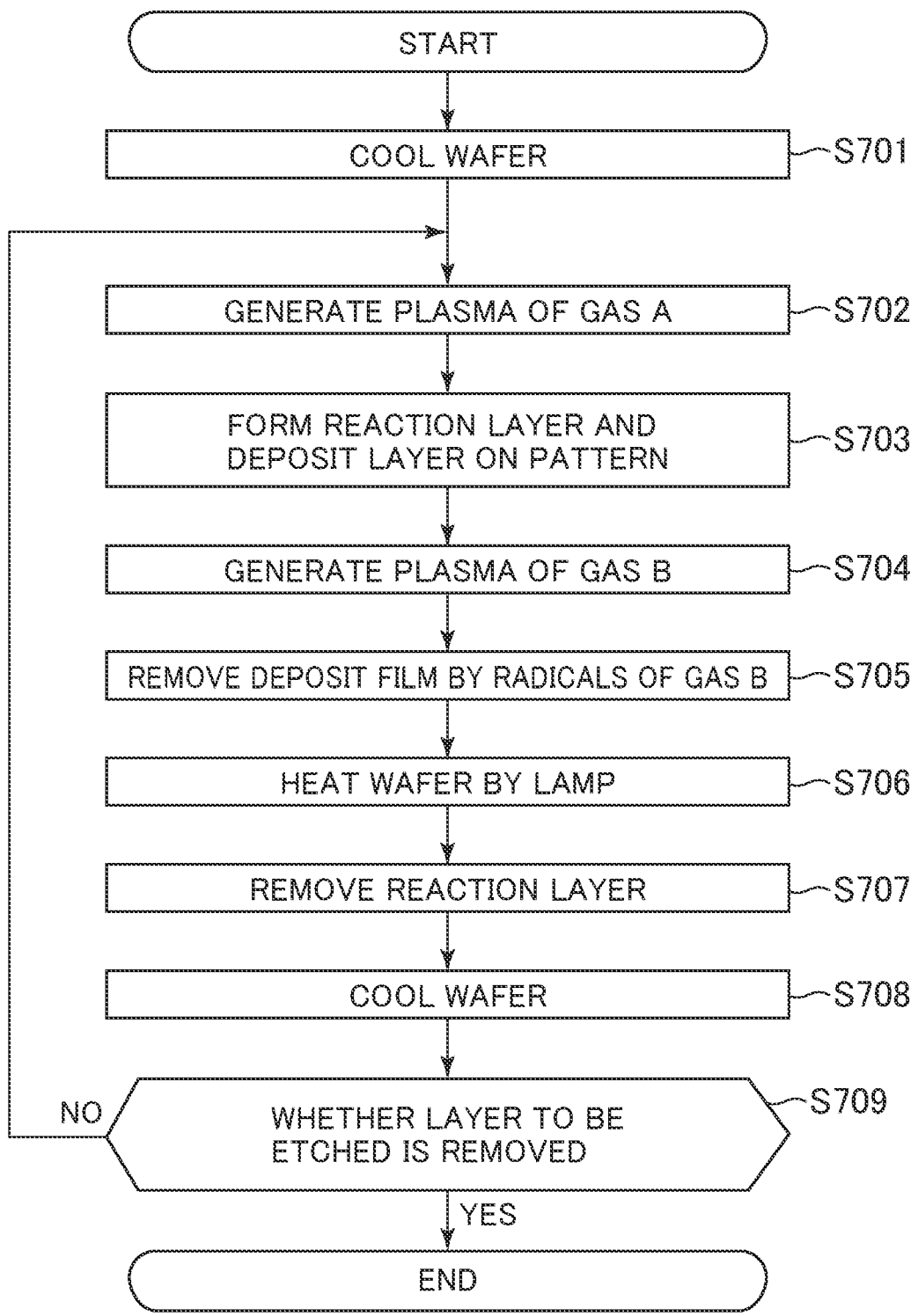
FIG. 7 is a flowchart illustrating a procedure of processing in the first embodiment of the invention.

A procedure of the etching process in the first embodiment described using FIGS. 5 and 6 is shown in a flowchart of FIG. 7 with reference to FIG. 1.

First, the wafer 2 is mounted on the stage 4, and while the electrostatic adsorption electrode 30 is operated to allow the wafer 2 to be electrostatically adsorbed to the stage 4, He gas is introduced to between the back surface of the wafer 2 and the stage 4 to cool the wafer 2 (S701).

Subsequently, the gas A is introduced into the quartz chamber 12, and while the degree of opening of the pressure adjusting means 14 is adjusted to set the internal pressure (vacuum degree) of each of the quartz chamber 12 and the processing chamber 1 to a predetermined value, high-frequency power is applied from the high-frequency power source 20 to an IPC coil 34 so that plasma 10 is generated within the quartz chamber 12 containing the gas A introduced therein (S702). The reaction layer 604 is formed on the surface of the layer to be etched 601 by radicals, which reach the processing chamber 1 after passing through the slit plate 78 and adhere to the surface of the wafer 2, of the radicals of the gas A generated within the plasma 10, and thus the deposit film 606 is formed on the surface of the undesirable layer to be etched 602 (S703).

Subsequently, while the high-frequency power supplied from the high-frequency power source 20 to the IPC coil 34 is cut off to extinguish the plasma within the quartz chamber 12, the gas species to be supplied into the quartz chamber 12 is switched from the gas A to the gas B. Subsequently, while the internal pressure (vacuum degree) of each of the quartz chamber 12 and the processing chamber 1 is set to a predetermined value, high-frequency power is applied from the high-frequency power source 20 to the IPC coil 34 to generate the plasma 10 within the quartz chamber 12 containing the gas B introduced therein (S704).

The deposit film 606 formed on the surface of the undesirable layer to be etched 602 is removed by radicals, which reach the processing chamber 1 after passing through the slit plate 78 and adhere to the surface of the wafer 2, of the radicals of the gas B generated within the plasma 10 in the quartz chamber (S705).

Subsequently, while the deposit film 606 is removed, the high-frequency power applied from the high-frequency power source 20 to the IPC coil 34 is cut off to extinguish the plasma within the quartz chamber 12. In such a state, the gas B is stopped from being supplied into the quartz chamber 12, and He gas is stopped from being introduced to between the back surface of the wafer 2 and the stage 4, and power is applied from the IR lamp power source 64 to the IR lamp 62 to start heating of the wafer 2 so that output from the IR lamp power source 64 is controlled to adjust the temperature of the wafer 2 to a certain value (S706). The wafer 2 is heated and maintained to a certain temperature, thereby the reaction layer 604 formed on the surface of the layer to be etched 601 is activated and desorbed from the surface of the layer to be etched 601 (S707).

Subsequently, application of power from the IR lamp power source 64 to the IR lamp 62 is cut off, and He gas is introduced to between the back surface of the wafer 2, on which the reaction layer 604 is desorbed from the surface of the layer to be etched 601, and the stage 4 to cool the wafer 2 (S708).

Such steps S701 to S708 are repeated until the layer to be etched 601 is completely removed (S709), making it possible to remove the layer to be etched 601.

As described above, in the wafer processing method of the first embodiment, a film layer on a wafer is etched by repeating processing steps including a step of supplying active species particles (radicals) to the surface of an upper layer of a film structure containing upper and lower film layers on the wafer surface to forma reaction product layer, and a step of desorbing and removing the reaction product layer by wafer heating, and the method is characterized by performing a step of removing radical-induced adhering matter, which adheres to the surface of the lower layer after the step of forming the reduction product layer, by the plasma generated in the processing chamber using oxygen gas, and then removing the reaction product layer.

In addition, the first embodiment is characterized by performing the step of removing the reaction product layer while generating the plasma using oxygen in the processing chamber.

According to the first embodiment, the layer to be etched 601 can be securely removed without roughening the surface of the undesirable layer to be etched 602.

Second Embodiment

A second embodiment is now described with reference to FIGS. 8 and 9. In the first embodiment, as in the flowchart of FIG. 7, the step of lamp-heating the wafer (S706) is performed after the step of removing the deposit film by the radicals of the gas B (S705). In some case, however, the deposit film is not perfectly removed by the radicals of the gas B, and thus part of the deposit film remains on the surface of the undesirable layer to be etched 602. In the second embodiment, even if the deposit film is thus not perfectly removed by the radicals of the gas B and thus remains on part of the surface of the undesirable layer to be etched 602, the deposit film can be securely removed.

Figure 8:
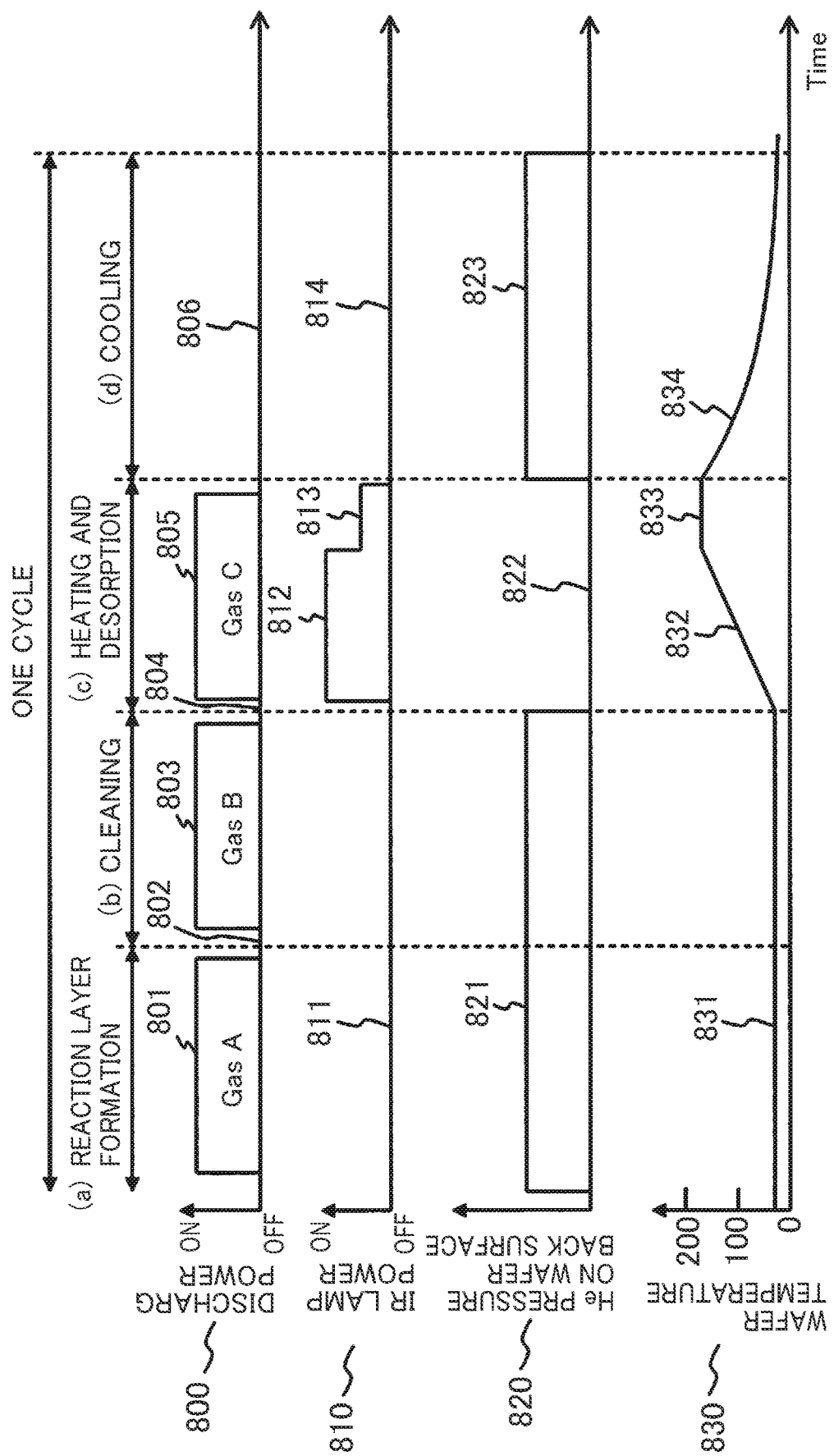
FIG. 8 is a time chart of basic processing of main components of a second embodiment of the invention.
Figure 9:
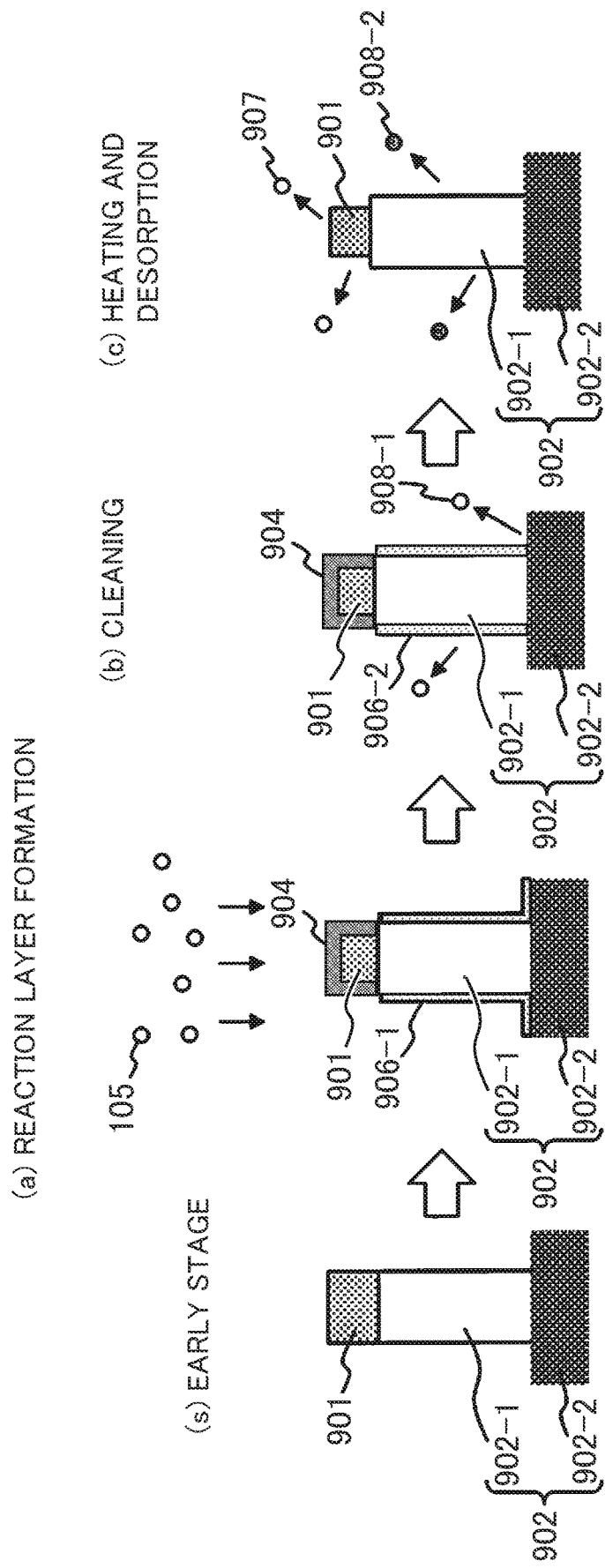
FIG. 9 includes views illustrating a change in state of a fine pattern on a wafer as a sample to be processed in the second embodiment of the invention.

FIG. 8 shows a time chart of the processing of the second embodiment, and FIG. 9 shows a state of a fine pattern on the wafer.

While the wafer 2 is mounted on the stage 4, the electrostatic adsorption electrode 30 is operated so that the wafer 2 is electrostatically adsorbed to the stage 4, and He gas is supplied to between the back surface of the wafer 2 and the stage 4 to cool the wafer 2 (He pressure 820 on the wafer back surface is in a state 821). In this state, the wafer 2 has a sectional shape as shown in initial stage of FIG. 9(S).

Subsequently, the processing gas A is supplied into the quartz chamber 12, and high-frequency power (discharge power) is applied from the high-frequency power source 20 to the ICP coil 34 for plasma discharge within the quartz chamber 12 (discharge power 800 is ON (state 801)).

Consequently, radicals generated in the plasma are applied to the wafer to form a reaction layer 904 on the surface of a layer to be etched 901 (reaction layer formation step of FIG. 8(a), reaction layer formation of FIG. 9(a)). At this time, the radicals adhere to or are accumulated on surfaces of layers 902-1 and 902-2 as undesirable layers to be etched (hereinafter, such layers are generically called undesirable layer to be etched 902), and thus a deposit film 906 is formed.

Subsequently, application of the high-frequency power to the ICP coil 34 is stopped (802 of FIG. 8), and supply of the gas B to the quartz chamber 12 is started while supply of the gas A thereto is stopped. In this state, high-frequency power (discharge power) is applied from the high-frequency power source 20 to the ICP coil 34 for plasma discharge within the quartz chamber 12 (803 of FIG. 8).

Consequently, irradiation of the wafer 2 with the radicals generated in the plasma allows a component, which is removable at low temperature, of the deposit film 906-1 formed on the surface of the undesirable layer to be etched 902 to be volatilized and removed in a form of a vaporization product (volatile) 908-1 (cleaning step of FIG. 8(b), cleaning of FIG. 9(b)). During the reaction layer formation step of FIG. 8(a) and the cleaning step of FIG. 8(b), IR lamp power 810 is OFF, i.e., in a state 811. In addition, He is supplied to the back surface of the wafer 2, and thus He pressure 820 on the wafer back surface is in a state 821, and temperature 830 of the wafer 2 is kept cooled (831).

Subsequently, application of the high-frequency power to the ICP coil 34 is stopped (804 of FIG. 8), and supply of the gas C to the quartz chamber 12 is started while supply of the gas B thereto is stopped. In this state, high-frequency power (discharge power) is applied from the high-frequency power source 20 to the ICP coil 34 for plasma discharge within the quartz chamber 12 (805 of FIG. 8). At this time, supply of He gas to between the back surface of the wafer 2 and the stage 4 is stopped (822) to stop cooling of the wafer 2.

While the plasma discharge is performed using the gas C, output of the IR lamp power source 64 (IR lamp power 810) is turned on to switch the IR lamp 62 on (812), and the wafer 2 is heated by IR light transmitted by the light transmission window 74 (wafer temperature 830 of FIG. 8 is in a state 832). When the temperature of the wafer 2 reaches a predetermined temperature (833), the IR lamp power 810 is reduced and maintained in a state 813 for a certain time, and then discharge power 800 is turned off (806), and the IR lamp power 810 is turned off (814), and the He pressure 820 on the wafer back surface is increased into a state 823 to start cooling of the wafer 2 (834).

Consequently, a deposit film 906-2, which has not been removed at low temperature and remains on the surface of the undesirable layer to be etched 902, is vaporized and removed in a form of a vaporization product (volatile) 908-2, and the reaction layer 904 formed on the surface of the layer to be etched 901 is vaporized in a form of a vaporization product (volatile) 907 and desorbed.

Processing in such a procedure makes it possible to suppress damage such as surface roughness to the surface of the undesirable layer to be etched 902. As with the gas B, the gas C must be a gas species having no adverse influence on volatility of the reaction layer 904.

The gas C is also effectively selected for the purpose of adjusting a chemical composition of the surface of the undesirable layer to be etched 902. For example, when the undesirable layer to be etched 902 includes $SiO_2$, a gas mainly containing $O_2$ is effectively used as the processing gas C to terminate a dangling bond of Si in the surface in a form of Si—O and replace Si-M (M is H, F, C) with Si—O.

Figure 10:
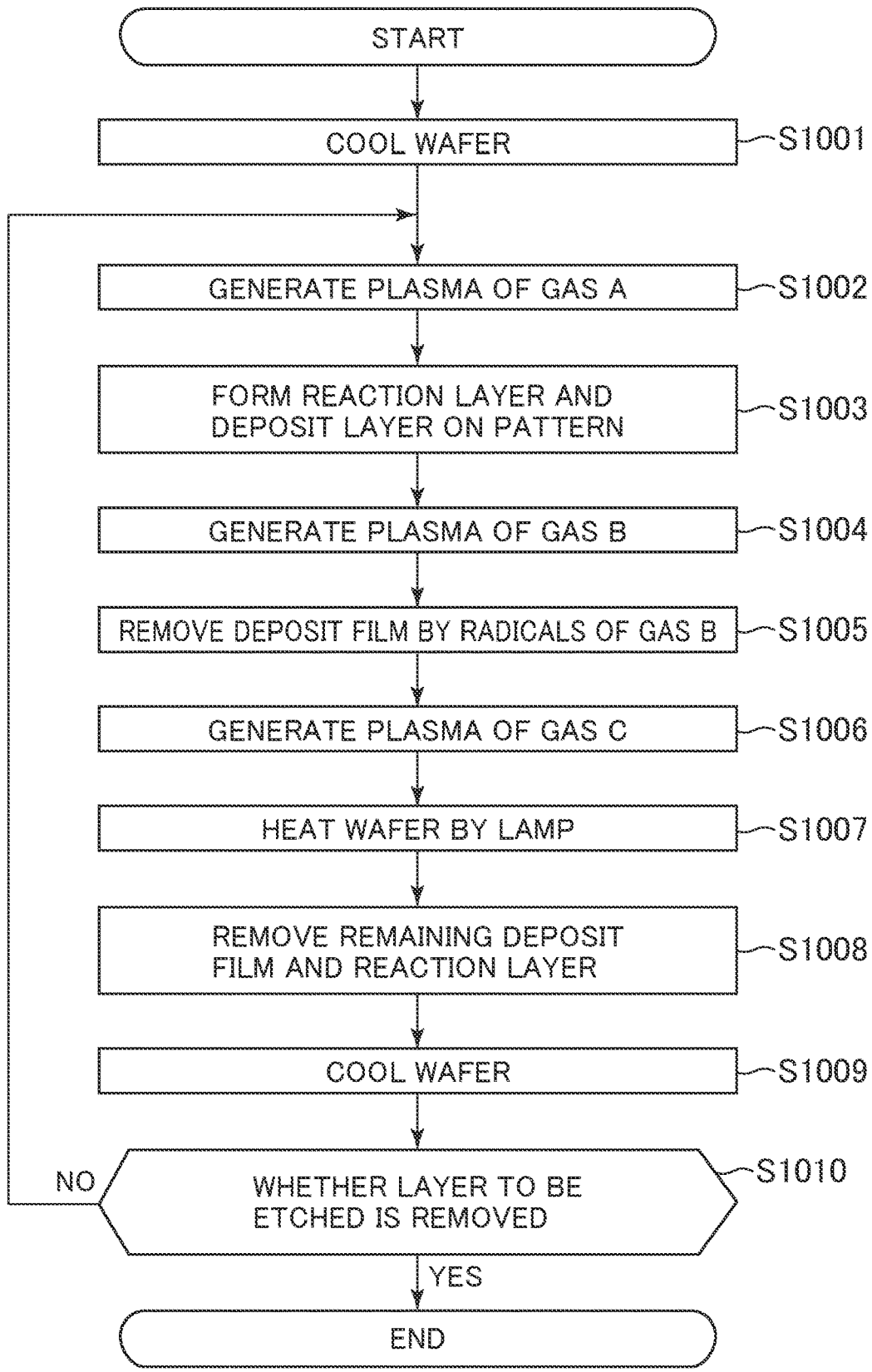
FIG. 10 is a flowchart illustrating a procedure of processing in the second embodiment of the invention.

FIG. 10 is a flowchart showing a procedure of the etching processing of the second embodiment.

First, the wafer 2 is mounted on the stage 4, and while the electrostatic adsorption electrode 30 is operated to allow the wafer 2 to be electrostatically adsorbed to the stage 4, He gas is introduced to between the back surface of the wafer 2 and the stage 4 to cool the wafer 2 (S1001).

Subsequently, the gas A is introduced into the quartz chamber 12, and while the degree of opening of the pressure adjusting means 14 is adjusted to set the internal pressure (vacuum degree) of each of the quartz chamber 12 and the processing chamber 1 to a predetermined value, high-frequency power is applied from the high-frequency power source 20 to the IPC coil 34 to generate the plasma 10 within the quartz chamber containing the gas A introduced therein (S1002). The reaction layer 904 is then formed on the surface of the layer to be etched 901 by radicals, which reach the processing chamber 1 after passing through the slit plate 78 and adhere to the surface of the wafer 2, of the radicals of the gas A generated within the plasma 10, and thus the deposit film 906-1 is formed on the surface of the undesirable layer to be etched 902 (S1003).

Subsequently, while the high-frequency power applied from the high-frequency power source 20 to the IPC coil 34 is cut off to extinguish the plasma within the quartz chamber 12, the gas species to be supplied into the quartz chamber 12 is switched from the gas A to the gas B. Subsequently, while the internal pressure (vacuum degree) of each of the quartz chamber 12 and the processing chamber 1 is set to a predetermined value, high-frequency power is applied from the high-frequency power source 20 to the IPC coil 34 to generate the plasma 10 within the quartz chamber 12 containing the gas B introduced therein (S1004).

A component, which is removable at low temperature, of the deposit film 906-1 formed on the surface of the undesirable layer to be etched 902 is volatilized and removed in a form of a vaporization product 908-1 by radicals, which reach the processing chamber 1 after passing through the slit plate 78 and adhere to the surface of the wafer 2, of the radicals of the gas B generated within the plasma 10 in the quartz chamber (S1005).

Subsequently, any component removable at low temperature is removed from the deposit film 906-1, so that the deposit film 906-2 remains. In such a state, while the high-frequency power applied from the high-frequency power source 20 to the IPC coil 34 is cut off to extinguish the plasma within the quartz chamber 12, the gas B is stopped from being supplied into the quartz chamber 12, and He gas is stopped from being introduced to between the back surface of the wafer 2 and the stage 4.

Subsequently, the gas C is supplied into the quartz chamber 12, and high-frequency power is applied from the high-frequency power source 20 to the IPC coil 34 to generate the plasma 10 within the quartz chamber 12 containing the gas C introduced therein (S1006). Further, power is applied from the IR lamp power source 64 to the IR lamp 62 to start heating of the wafer 2 within the processing chamber 1 (S1007). Through such plasma generation and heating using the IR lamp, the deposit film 906-2, which has not been removed by the processing at low temperature in the step S1005 and remains on the surface of the undesirable layer to be etched 902, is vaporized and removed in a form of the vaporization product (volatile) 908-2, and the reaction layer 904 formed on the surface of the layer to be etched 901 is desorbed (S1008). This makes it possible to suppress damage such as surface roughness to the surface of the undesirable layer to be etched 902.

Subsequently, application of power from the IR lamp power source 64 to the IR lamp 62 is cut off, and He gas is introduced to between the back surface of the wafer 2, on which the reaction layer 904 is desorbed from the surface of the layer to be etched 901, and the stage 4 to cool the wafer 2 (S1009).

Such steps S1001 to S1009 are repeated until the layer to be etched 901 is completely removed (S1010), making it possible to remove the layer to be etched 901.

According to the second embodiment, since the deposit film 906-1 formed on the surface of the undesirable layer to be etched 902 can be securely removed through the two-stage removal steps, the layer to be etched 901 can be securely removed without roughening the surface of the undesirable layer to be etched 902.

Third Embodiment

Figure 11:
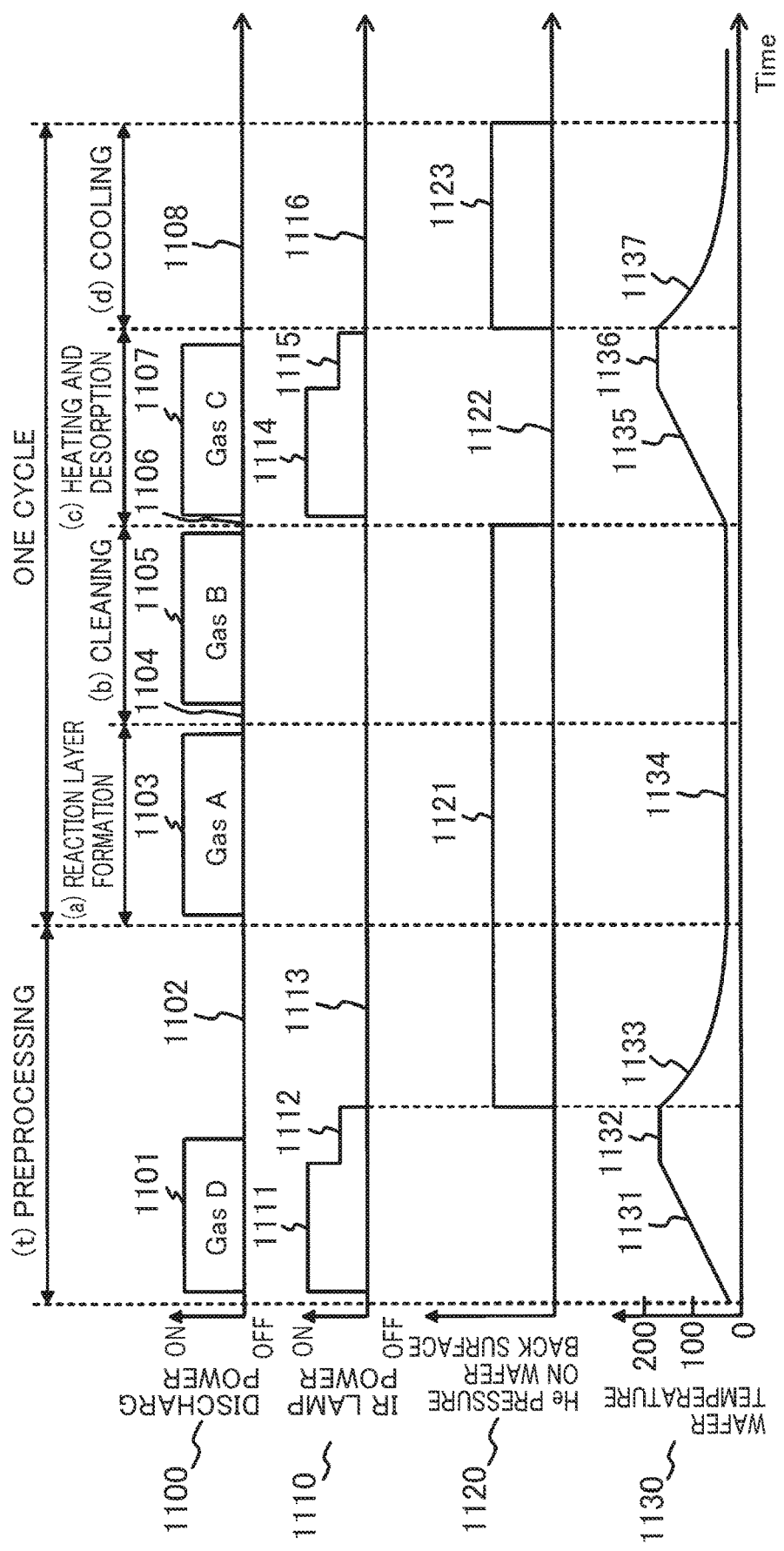
FIG. 11 is a time chart of basic processing of main components of a third embodiment of the invention.

A third embodiment is now described with reference to FIGS. 11 and 12. In the third embodiment, the following preprocessing is performed in addition to steps similar to those described in the second embodiment. That is, a protective film is formed on the surface of the undesirable layer to be etched. FIG. 11 shows a time chart of the processing of the third embodiment, and FIG. 12 shows a state of a fine pattern on the wafer.

First, before starting cycle processing similar to that described in the second embodiment, the following preprocessing is performed. That is, IR lamp power 1110 is turned ON (1111), so that the wafer 2 is heated (1131) to increase the wafer temperature 1130. In addition, discharge power 1100 is turned on (1101) for discharge with a processing gas D. When the wafer temperature 1130 reaches a predetermined temperature (1132), the IR lamp power 1110 is switched so that output of the IR lamp (1112) is reduced to maintain the temperature of the wafer 2 constant (1132). In addition, a protective layer 1209 is selectively formed on the surfaces of layers 1202-1 and 1202-2 as undesirable layers to be etched (hereinafter, such layers are generically called undesirable layer to be etched 1202) (preprocessing step of FIG. 11(*t*), preprocessing of FIG. 12(*t*)).

After the protective layer 1209 has been formed, the discharge power 1100 is turned off to stop discharge with the processing gas D (1102), and the IR lamp power 1110 is turned off (1113). In addition, the electrostatic adsorption electrode 30 is operated to allow the wafer 2 to be electrostatically adsorbed by the stage 4, and He gas is supplied to between the back surface of the wafer 2 and the stage 4 to increase He pressure 1120 on the wafer back surface to a pressure 1121, thereby the wafer 2 is cooled to decrease the wafer temperature 1130 to a temperature 1133.

Subsequently, cycle processing is performed as follows. First, while the wafer 2 is cooled and the wafer temperature 1130 is maintained at a temperature 1134, the processing gas A is supplied and discharge power 1100 is kept ON (1103) to perform plasma discharge, and radicals generated in the plasma are applied to the wafer to form a reaction layer 1204 on the surface of a layer to be etched 1201 as a desirable film to be etched (reaction layer formation of FIG. 11(*a*), reaction layer formation of FIG. 12(*a*)). At this time, since the protective layer 1209 is formed over the undesirable layer to be etched 1202, a deposit film 1206 is formed on the surface of the protective layer 1209.

Subsequently, the discharge power 1100 is kept OFF (1104) to stop discharge with the processing gas A, and a gas species supplied into the quartz chamber 12 is switched from the gas A to the gas B. When the gas B has been supplied into the quartz chamber 12, the discharge power 1100 is turned on (into 1105) to start plasma discharge using the gas B. In this state, cooling of the wafer 2 is continued. The wafer is irradiated with the radicals 105 generated in the plasma using the gas B, thereby a component, which is removable at low temperature, of the deposit film 1206 is volatilized and removed in a form of a vaporization product (volatile) 1208-1 (cleaning step of FIG. 11(*b*), cleaning of FIG. 12(*b*)).

Subsequently, the discharge power 1100 is turned off (into 1106) to stop discharge with the processing gas B, and the gas species supplied into the quartz chamber 12 is switched from the gas B to the gas C. When the gas C has been supplied into the quartz chamber 12, the discharge power 1100 is turned on (into 1107) to start plasma discharge using the gas C. At this time, supply of He gas to the wafer back surface is stopped to reduce the He pressure 1120 on the wafer back surface (1122), and the IR lamp power 1110 is turned on (into 1114) so that heating by the IR lamp is started to increase the wafer temperature 1130 to a predetermined temperature 1136 (1135). When the temperature of the wafer 2 reaches the predetermined temperature 1136, the IR lamp power 1110 is reduced to reduce heating by the IR lamp 62 (1115) to maintain the wafer temperature 1130 to be constant (1136).

Through such processing, a remaining deposit film 1206-6 that has not been removed at low temperature is removed in a form of a vaporization product (volatile) 1208-2, and the reaction layer 1204 formed on the surface of the layer to be etched 1201 is vaporized and desorbed in a form of a vaporization product (volatile) 1207. This makes it possible to suppress roughness or shaving of the surface of the undesirable layer to be etched 1202. As with the gas B, the gas C must be a gas species having no adverse influence on volatility of the reaction layer 1204.

The wafer is maintained in this state for a certain time, and then the discharge power 1100 is turned off (into 1108) and the IR lamp power 1110 is turned off (into 1116), and supply of He to the back surface of the wafer 2 is started to increase the He pressure 1120 on the wafer back surface to be into a state 1123. As a result, the wafer 2 is cooled, and the wafer temperature 1130 decreases (1137).

For the processing gas D used in the preprocessing step, for example, when the layer to be etched 1201 includes a nitride film including SiN or TiN, and when the undesirable layer to be etched 1202 includes p-Si, SiON, or SiOCN, a processing gas mainly containing $O_2$ is effectively used to form a protective film of Si—O on the surface. In such a case, a gas mainly containing $O_2$ is also effectively used as the gas C, so that a dangling bond of Si— is returned to Si—O and Si-M (M is H, F, C) is returned to Si—O in the Si—O protective film.

When the layer to be etched 1201 includes a nitride film including SiN or TiN, and when the undesirable layer to be etched 1202 includes SiON or SiOCN, a processing gas including one of H, O, and C is effectively used to extract N atoms from the surface of SiON or SiOCN to decrease a composition ratio of nitrogen.

FIG. 13 is a flowchart showing a procedure of the processing of the third embodiment.

First, the wafer 2 is mounted on the stage 4, and while the electrostatic adsorption electrode 30 is operated to allow the wafer 2 to be electrostatically adsorbed to the stage 4, the preprocessing is performed as follows. That is, the IR lamp is turned ON (S1301), and while the wafer 2 is heated, plasma of the processing gas D is generated (S1302), and while the temperature of the wafer 2 is maintained constant, the protective layer 1209 is selectively formed on the surface of the undesirable layer to be etched 1202.

After the lapse of certain time, the plasma is extinguished, and heating by the IR lamp is stopped (S1303), and He gas is introduced to between the back surface of the wafer 2 and the stage 4 to cool the wafer 2 (S1304).

Subsequently, the gas A is introduced into the quartz chamber 12, and while the degree of opening of the pressure adjusting means 14 is adjusted to set internal pressure (vacuum degree) of each of the quartz chamber 12 and the processing chamber 1 to a predetermined value, high-frequency power is applied from the high-frequency power source 20 to the IPC coil 34 to generate the plasma 10 within the quartz chamber 12 containing the gas A introduced therein (S1305). The reaction layer 1204 is then formed on the surface of the layer to be etched 1201 by radicals 105, which reach the processing chamber 1 after passing through the slit plate 78 and adhere to the surface of the wafer 2, of the radicals of the gas A generated within the plasma 10, and thus the deposit film 1206 is formed on the protective layer 1209 on the surface of the undesirable layer to be etched 1202 (S1306).

Subsequently, while the high-frequency power applied from the high-frequency power source 20 to the IPC coil 34 is cut off to extinguish the plasma within the quartz chamber 12, the gas species supplied into the quartz chamber 12 is switched from the gas A to the gas B. Subsequently, the internal pressure (vacuum degree) of each of the quartz chamber 12 and the processing chamber 1 is set to a predetermined value, high-frequency power is applied from the high-frequency power source 20 to the IPC coil 34 to generate the plasma 10 within the quartz chamber 12 containing the gas B introduced therein (S1307).

A component, which is removable at low temperature, of the deposit film 1206 formed on the surface of the undesirable layer to be etched 1202 is volatilized and removed in a form of a vaporization product 1208-1 by radicals, which reach the processing chamber 1 after passing through the slit plate 78 and adhere to the surface of the wafer 2, of the radicals of the gas B generated within the plasma 10 in the quartz chamber (S1308).

Subsequently, any component removable at low temperature is removed from the deposit film 1206, so that the deposit film (protective layer) 1209 remains. In such a state, while the high-frequency power applied from the high-frequency power source 20 to the IPC coil 34 is cut off to extinguish the plasma within the quartz chamber 12, the gas B is stopped from being supplied into the quartz chamber 12, and He gas is stopped from being introduced to between the back surface of the wafer 2 and the stage 4.

Subsequently, the gas C is supplied into the quartz chamber 12, and high-frequency power is applied from the high-frequency power source 20 to the IPC coil 34 to generate the plasma 10 within the quartz chamber 12 containing the gas C introduced therein (S1309). Further, power is applied from the IR lamp power source 64 to the IR lamp 62 to start heating of the wafer 2 within the processing chamber 1 (S1310). Through such plasma generation and heating using the IR lamp, the deposit film (protective layer) 1209, which has not been removed by the processing at low temperature in the step S1308 and remains on the surface of the undesirable layer to be etched 1202, is vaporized and removed in a form of a vaporization product 1208-2, and the reaction layer 1204 formed on the surface of the layer to be etched 1201 is desorbed (S1311). This makes it possible to suppress damage such as surface roughness to the surface of the undesirable layer to be etched 1202.

Subsequently, application of power from the IR lamp power source 64 to the IR lamp 62 is cut off, and He gas is introduced to between the back surface of the wafer 2, on which the reaction layer 1204 is desorbed from the surface of the layer to be etched 1201, and the stage 4 to cool the wafer 2 (S1312).

Such steps S1304 to S1312 are repeated until the layer to be etched 1201 is completely removed (S1313), making it possible to remove the layer to be etched 1201 without any damage to the undesirable layer to be etched 1202.

According to the third embodiment, the protective layer 1209 is beforehand formed on the undesirable layer to be etched 1202 in the preprocessing step, which makes it possible to suppress roughness or shaving of the surface of the undesirable layer to be etched 1202 in the step of removing the layer to be etched 1201.

Although the invention achieved by the inventors has been described in detail according to some embodiments, the invention should not be limited thereto, and it will be appreciated that various modifications or alterations may be made within the scope without departing from the gist of the invention. For example, the above-described embodiments have been described in detail to clearly explain the invention, and the invention is not necessarily limited to the embodiments each having all the described configurations. Furthermore, a configuration of one embodiment can be added to, eliminated from, or substituted for part of a configuration of another embodiment.

INDUSTRIAL APPLICABILITY

The invention can be applied to a step of an etching process of a semiconductor wafer in a manufacturing process of a semiconductor device.

LIST OF REFERENCE SIGNS

1 Processing chamber, 2 Wafer, 4 Stage, 5 Shower plate, 6 Top board, 10 Plasma, 11 Base chamber, 12 Quartz chamber, 14 Pressure adjusting means, 15 Exhaust means, 16 Vacuum exhaust pipe, 17 Gas dispersion plate, 25 High-frequency cut filter, 30 Electrostatic adsorption electrode, 31 DC power source for electrostatic adsorption, 38 Chiller, 40 Control section, 41 Arithmetic section, 50 Mass flow controller, 51 Mass-flow-controller control section, 52 Valve, 62 IR lamp, 63 Reflection plate, 64 IR lamp source, 70 Thermocouple, 71 Thermocouple thermometer, 74 Light transmission window, 75 Gas passage, 78 Slit plate, 92 Optical fiber, 93 External IR light source, 94 Optical-path switch, 95 Optical distributer, 96 Spectroscope, 97 Detector, 98 Optical multiplexer, 100 Plasma processing apparatus, 101, 601, 901, 1201 Layer to be etched, 102, 602, 902, 1202 Film other than layer to be etched (undesirable layer to be etched), 104, 604, 904, 1204 Reaction layer, 105 Radical, 106, 606, 906-1 Deposit film, 107, 607, 907, 1207 Vaporization product, 608, 908-1, 908-2, 1208-1, 1208-2 Vaporization product, 1209 Protective layer, 1111, 111-2 Surface roughness

The invention claimed is:

1. A substrate processing method to be processed to process a film structure having at least two types of films beforehand disposed on the sample to be processed disposed in a processing chamber within a vacuum vessel, wherein the film structure is processed by repeating the following steps in the sequence as listed:
    an adsorption step of supplying activated particles into the processing chamber and allowing the particles to be adsorbed to a surface of a desirable film to be etched in the films to allow the particles to combine with a material of the desirable film to be etched to form a reaction layer,
    a removal step of using plasma generated by supplying oxygen into the processing chamber to selectively remove a deposit containing particles adhering to a surface of an undesirable film to be etched in the films, the particles being some of the activated particles supplied into the processing chamber, and
    a desorption step of desorbing and removing the reaction layer on the desirable film to be etched by heating the sample to be processed subjected to the adsorption step and the removal step.

2. The method according to claim 1, wherein in the desorption step, while oxygen gas is supplied into the processing chamber to generate plasma, the sample to be processed is heated to desorb and remove the reaction layer of the desirable film to be etched.

3. The method according to claim 1, wherein the undesirable film to be etched includes Si, $SiO_2$, or SiOC as a material, and the desirable film to be etched includes N as a material.

4. The method according to claim 1, wherein before start of the adsorption step, an oxidation step is performed to oxidize the surface of the undesirable film to be etched in the films and thus an oxide film is formed.

5. The method according to claim 2, wherein the undesirable film to be etched includes Si, $SiO_2$, or SiOC as a material, and the desirable film to be etched includes N as a material.

6. The method according to claim 2, wherein before start of the adsorption step, an oxidation step is performed to oxidize the surface of the undesirable film to be etched in the films and thus an oxide film is formed.

7. A plasma processing apparatus, comprising:
    a plasma generation chamber;
    a processing chamber connected to the plasma generation chamber and internally having a mounting stage on which a sample to be processed is mounted;
    a processing gas supply section that supplies a processing gas into the plasma generation chamber;

a plasma generation section that generates plasma within the processing chamber containing the processing gas supplied by the processing gas supply section;

a heating section having a lamp to heat the sample to be processed mounted on the mounting stage in the processing chamber;

a slit plate provided between the plasma generation section and the mounting stage;

a cooling gas supply section that supplies a gas to between the sample to be processed and the mounting stage, the gas cooling the sample to be processed mounted on the mounting stage in the processing chamber; and a control section that controls the processing gas supply section, the plasma generation section, the heating section, and the cooling gas supply section, wherein the control section repeatedly performs in the sequence as listed a process in which while the processing gas supply section is controlled to supply a first processing gas into the plasma generation chamber, the plasma generation section is controlled to generate plasma of the first processing gas within the plasma generation chamber to generate a reaction species, and the reaction species supplied from the plasma generation chamber into the processing chamber is allowed to adhere to a plurality of films beforehand disposed on the sample to be processed cooled by controlling the cooling gas supply section and react with a material of a surface of a desirable film to be etched to form a reaction layer, a process in which while the processing gas supply section is controlled to switch a gas to be supplied into the plasma generation chamber from the first processing gas to a second processing gas, the plasma generation section is controlled to generate plasma of the second processing gas within the plasma generation chamber to activate the second processing gas, and the activated second processing gas supplied from the plasma generation chamber into the processing chamber is used to selectively remove the reaction species adhering to a surface of an undesirable film to be etched in the films on the sample to be processed cooled by controlling the cooling gas supply section, and a process in which the heating section is controlled to heat the sample to be processed, thereby the reaction species adhering to a portion other than the desirable film to be etched is removed, and the reaction layer formed on the surface of the desirable film to be etched is vaporized and desorbed from the desirable film to be etched.

8. The plasma processing apparatus according to claim 7, further comprising a temperature measurement section to measure temperature of the mounting stage, wherein the control section controls output of a lamp to heat the sample to be processed in the heating section based on the temperature of the mounting stage measured by the temperature measurement section.

9. The plasma processing apparatus according to claim 7, wherein when the control section performs the process of desorbing the reaction layer formed on the desirable film to be etched from the desirable film to be etched, while the processing gas supply section is controlled to switch the gas to be supplied into the plasma generation chamber from the second processing gas to a third processing gas, the plasma generation section is controlled to generate plasma of the third processing gas within the plasma generation chamber to activate the third processing gas, and while the activated third processing gas is supplied from the plasma generation chamber into the processing chamber, the heating section is controlled to heat the sample to be processed, thereby the reaction layer formed on the desirable film to be etched, of the films in which the reaction species adhering to the portion other than the desirable film to be etched is removed is vaporized and desorbed from the desirable film to be etched.

10. The plasma processing apparatus according to claim 7, wherein before performing a process of controlling the processing gas supply section, the plasma generation section, and the cooling gas supply section to form the reaction layer through chemical combination with a material of the desirable film to be etched, the control section controls the processing gas supply section and the plasma generation section to supply oxygen gas into the plasma generation chamber to generate plasma of the oxygen gas to activate the oxygen gas, and controls the heating section to heat the sample to be processed while the activated oxygen gas is supplied from the plasma generation chamber into the processing chamber, thereby oxidizes a material of the surface of the undesirable film to be etched to form an oxide film.

11. The plasma processing apparatus according to claim 8, wherein when the control section performs the process of desorbing the reaction layer formed on the desirable film to be etched from the desirable film to be etched, while the processing gas supply section is controlled to switch the gas to be supplied into the plasma generation chamber from the second processing gas to a third processing gas, the plasma generation section is controlled to generate plasma of the third processing gas within the plasma generation chamber to activate the third processing gas, and while the activated third processing gas is supplied from the plasma generation chamber into the processing chamber, the heating section is controlled to heat the sample to be processed, thereby the reaction layer formed on the desirable film to be etched, of the films in which the reaction species adhering to the portion other than the desirable film to be etched is removed is vaporized and desorbed from the desirable film to be etched.

12. The plasma processing apparatus according to claim 8, wherein before performing a process of controlling the processing gas supply section, the plasma generation section, and the cooling gas supply section to form the reaction layer through chemical combination with a material of the desirable film to be etched, the control section controls the processing gas supply section and the plasma generation section to supply oxygen gas into the plasma generation chamber to generate plasma of the oxygen gas to activate the oxygen gas, and controls the heating section to heat the sample to be processed while the activated oxygen gas is supplied from the plasma generation chamber into the processing chamber, thereby oxidizes a material of the surface of the undesirable film to be etched to form an oxide film.

* * * * *